(12) United States Patent
Iwashige

(10) Patent No.: US 9,536,802 B2
(45) Date of Patent: Jan. 3, 2017

(54) SEMICONDUCTOR DEVICE

(71) Applicant: DENSO CORPORATION, Kariya, Aichi-pref. (JP)

(72) Inventor: Tomohito Iwashige, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/913,712

(22) PCT Filed: Aug. 21, 2014

(86) PCT No.: PCT/JP2014/004286
§ 371 (c)(1),
(2) Date: Feb. 23, 2016

(87) PCT Pub. No.: WO2015/029386
PCT Pub. Date: Mar. 5, 2015

(65) Prior Publication Data
US 2016/0204046 A1    Jul. 14, 2016

(30) Foreign Application Priority Data

Aug. 30, 2013   (JP) .................................. 2013-179141

(51) Int. Cl.
*H01L 23/495*   (2006.01)
*H01L 23/31*    (2006.01)
(Continued)

(52) U.S. Cl.
CPC ........... *H01L 23/3142* (2013.01); *H01L 23/29* (2013.01); *H01L 23/293* (2013.01); *H01L 23/31* (2013.01); *H01L 23/49562* (2013.01); *H01L 23/49568* (2013.01); *H01L 24/33* (2013.01); *H01L 29/1608* (2013.01); *H01L 29/7395* (2013.01); *H01L 29/7802* (2013.01); *H01L 29/872* (2013.01); *H01L 24/73* (2013.01); *H01L 2224/32245* (2013.01);
(Continued)

(58) Field of Classification Search
CPC ............................. H01L 23/3142; H01L 23/29
USPC ....................................................... 257/669
See application file for complete search history.

(56) References Cited

U.S. PATENT DOCUMENTS

2003/0132530 A1    7/2003   Teshima et al.

FOREIGN PATENT DOCUMENTS

JP            2822989 B2    11/1998
JP         2002-373961 A    12/2002
(Continued)

OTHER PUBLICATIONS

International Search Report of the International Searching Authority dated Nov. 18, 2014 issued in the corresponding International application No. PCT/JP2014/004286 (and English translation).

(Continued)

*Primary Examiner* — Anthony Ho
(74) *Attorney, Agent, or Firm* — Posz Law Group, PLC

(57) ABSTRACT

A semiconductor device includes a semiconductor chip, a resin mold portion sealing a component in which the semiconductor chip is included, and a bonding layer disposed between the resin mold portion and the component. The bonding layer is made of an organic resin that is disposed at an obverse side of the component, and includes a first layer bonded to the component and a second layer bonded to the resin mold portion. A loss coefficient tan δ of the first layer is smaller than a loss coefficient tan δ of the second layer within a temperature range of 200° C. to 250° C.

6 Claims, 3 Drawing Sheets

(51) Int. Cl.
  *H01L 23/29* (2006.01)
  *H01L 29/16* (2006.01)
  *H01L 29/739* (2006.01)
  *H01L 29/78* (2006.01)
  *H01L 29/872* (2006.01)
  *H01L 23/00* (2006.01)

(52) U.S. Cl.
  CPC ............... *H01L 2224/48091* (2013.01); *H01L 2224/48247* (2013.01); *H01L 2224/73265* (2013.01); *H01L 2224/8592* (2013.01); *H01L 2924/12032* (2013.01); *H01L 2924/13055* (2013.01); *H01L 2924/13091* (2013.01); *H01L 2924/181* (2013.01)

(56) References Cited

FOREIGN PATENT DOCUMENTS

| JP | 2003-124406 A | 4/2003 |
| JP | 2004-296906 A | 10/2004 |
| JP | 2005-142258 A | 6/2005 |
| JP | 2006-179538 A | 7/2006 |

OTHER PUBLICATIONS

Written Opinion of the International Searching Authority dated Nov. 18, 2014 issued in the corresponding International application No. PCT/JP2014/004286 (and English translation).

FIG. 3

|   | TYPE | Tg/°C | MAX tanδ (200 – 250°C) |
|---|---|---|---|
| a | POLYIMIDE | 300 | 0.08 |
| b | POLYAMIDE-IMIDE | 260 | 0.06 |
| c | POLYIMIDE | 210 | 1.74 (242°C) |
| d | POLYIMIDE-SILICON | 250 | 0.28 |
| e | POLYAMIDE-IMIDE | 220 | 1.19 (225°C) |

FIG. 4

| | | E1 | E2 | E3 | E4 | E5 |
|---|---|---|---|---|---|---|
| STRUCTURE | 1ST RESIN LAYER | a | a | b | d | d |
| | 2ND RESIN LAYER | c | e | c | c | e |
| | MOLD RESIN | A | A | A | A | A |
| PEELING | | 0% | 0% | 0% | 0% | 0% |

FIG. 5

| | | CE1 | CE2 | CE3 | CE4 | CE5 | CE6 | CE7 | CE8 | CE9 | CE10 |
|---|---|---|---|---|---|---|---|---|---|---|---|
| STRUCTURE | 1ST RESIN LAYER | a | b | c | d | e | c | c | c | e | e |
| | 2ND RESIN LAYER | N/A | N/A | N/A | N/A | N/A | a | b | d | a | b |
| | MOLD RESIN | A | A | A | A | A | A | A | A | A | A |
| | PEELING | <20% | ≥20% | ≥20% | ≥20% | ≥20% | ≥20% | ≥20% | ≥20% | ≥20% | ≥20% |

SEMICONDUCTOR DEVICE

CROSS REFERENCE TO RELATED APPLICATIONS

This application is the U.S. national phase of International Patent Application No. PCT/JP2014/004286 filed on Aug. 21, 2014 and is based on Japanese Patent Application No. 2013-179141 filed on Aug. 30, 2013, the disclosures of which are incorporated herein by reference.

TECHNICAL FIELD

The present disclosure relates to a semiconductor device that uses a resin-molded semiconductor chip.

BACKGROUND ART

Patent literature 1 proposes a structure that places a polyamide resin layer on a surface of a semiconductor chip or on a surface of a heat sink in order to prevent a resin from being peeled away from a semiconductor device. Herein, the semiconductor device includes a semiconductor chip and a heat sink that are both resin-molded. The above-mentioned structure can improve adhesive force between the semiconductor chip or the heat sink and a molded resin and prevent the resin from being peeled away from the semiconductor chip or from the heat sink even under a high temperature.

However, a temperature of 200° C. or higher generates a stress higher than the adhesive force to cause peeling even if the polyamide resin is used to increase the adhesive force between the semiconductor chip and the molded resin and the adhesive force between the heat sink and the molded resin as described above. In particular, silicon carbide (hereinafter referred to as SiC) used as a semiconductor material requires ensuring functions within a higher-temperature range of 200° C. to 250° C. compared to silicon semiconductors, for example.

PRIOR ART LITERATURES

Patent Literature

[Patent Literature 1] JP 2003-124406 A

SUMMARY OF INVENTION

In view of the foregoing difficulties, it is an object of the present disclosure to provide a semiconductor device which can suppress a peeling away between each component and the resin mold portion within a temperature range of 200° C. to 250° C.

According to an aspect of the present disclosure, a semiconductor device includes a semiconductor chip, a resin mold portion, and a bonding layer. The semiconductor chip has an obverse side and a reverse side, and includes a semiconductor element. The resin mold portion seals a component in which the semiconductor chip is included. The bonding layer is disposed between the resin mold portion and the component. The bonding layer is made of an organic resin that is disposed at an obverse side of the component. The bonding layer has a double-layered structure including a first layer bonded to the component and a second layer bonded to the resin mold portion. A loss coefficient tan δ of the first layer is smaller than a loss coefficient tan δ of the second layer within a temperature range of 200° C. to 250° C.

With the above semiconductor device, a peeling away between each component and the resin mold portion is suppressed within a temperature range of 200° C. to 250° C.

BRIEF DESCRIPTION OF DRAWINGS

The above and other objects, features and advantages of the present invention will become more apparent from the following detailed description made with reference to the accompanying drawings. In the drawings:

FIG. 3 is a diagram illustrating types of materials a through e used in an experiment, Tg/° C. of each material, and maximum value of tan δ of each material;

FIG. 4 is a diagram illustrating an experiment result using the materials illustrated in FIG. 3 according to an embodiment of the present disclosure; and FIG. 5 is a diagram illustrating an experiment result using the materials illustrated in FIG. 3 according to comparison examples.

EMBODIMENTS FOR CARRYING OUT INVENTION (First Embodiment)

Figure 1:
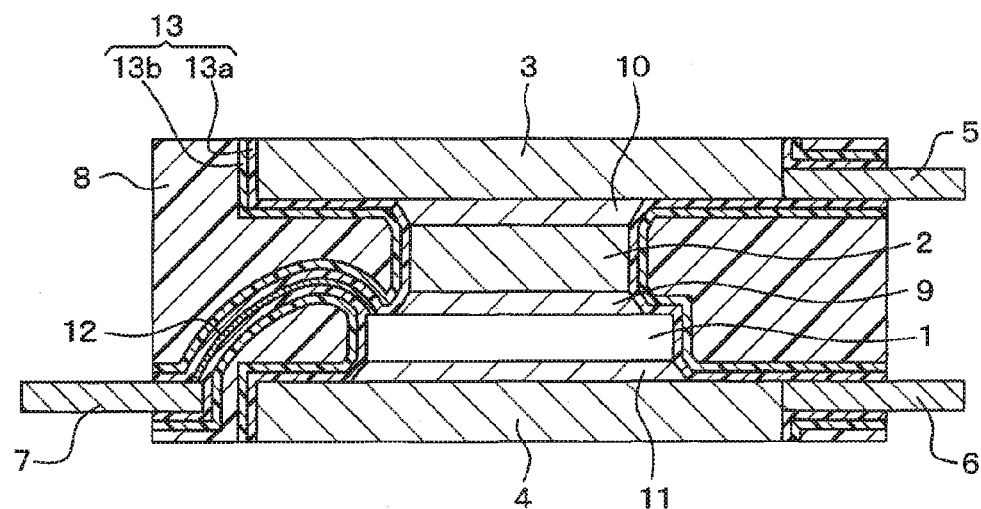
FIG. 1 is a diagram illustrating a cross-sectional configuration of a semiconductor device according to a first embodiment of the present disclosure.

The description below explains a semiconductor device according to a first embodiment of the present disclosure. As illustrated in FIG. 1, the semiconductor device according to the present embodiment includes a semiconductor chip 1, a metal block 2, heat sinks 3 and 4, and lead frames 5 through 7. A resin mold portion 8 seals these components to be integrated into the semiconductor device.

The semiconductor chip 1 is provided by forming a semiconductor power element such as MOSFET or IGBT or a semiconductor element such as a Schottky barrier diode into a chip on a SiC substrate. In the present embodiment, MOSFET will be described as an example of a semiconductor power element. The semiconductor chip 1 is shaped into a rectangular plate having an obverse side and a reverse side. According to the present embodiment, in the semiconductor chip 1, a gate electrode and a source electrode are disposed in the vicinity of the obverse side and a drain electrode is disposed in the vicinity of the reverse side.

The metal block 2 thermally connects the obverse side of the semiconductor chip 1 with the heat sink 3. For example, the metal block 2 is made of copper that ensures high electric conductivity and heat transfer coefficient. Specifically, the metal block 2 has a cuboid shape and has an obverse side and a reverse side. The reverse side of the metal block 2 is electrically and thermally connected to the MOSFET source electrode in the vicinity of the obverse side of the semiconductor chip 1 via a bonding material 9 such as solder. The obverse side of the metal block 2 is electrically and thermally connected to the heat sink 3 via a bonding material 10 such as solder.

The heat sinks 3 and 4 each functions as a radiator plate that widely diffuses and releases the heat transmitted from the semiconductor chip 1. For example, the heat sinks 3 and 4 are formed using copper as a base material that ensures high electric conductivity and high heat transfer coefficient. The surface of the heat sinks 3 and 4 may be gold-plated as needed. The heat sink 3 is electrically and thermally connected to the MOSFET source electrode disposed in the vicinity of the obverse side of the semiconductor chip 1 via the metal block 2. In this manner, the heat sink 3 functions as a radiator plate, and also functions as a wiring connected to the MOSFET source electrode. The heat sink 4 is electrically and thermally connected to the MOSFET drain electrode disposed in the vicinity of the reverse side of the semiconductor chip 1 via a bonding material 11 such as solder. In this manner, the heat sink 4 functions as a radiator plate, and also functions as a wiring connected to the MOSFET drain electrode. Each of the heat sinks 3 and 4 is configured to include a surface opposite the semiconductor chip 1 so that the surface is exposed from the resin mold portion 8. The exposed surface of the heat sink 3, 4 enables heat dissipation.

The lead frame 5 is integrated with or is connected to the heat sink 3. The lead frame 5 is extended toward outside of the resin mold portion 8 and functions as wiring that electrically connects the MOSFET source electrode with an outside connection object. The lead frame 6 is integrated with or is connected to the heat sink 4. The lead frame 6 is extended toward outside of the resin mold portion 8 and functions as wiring that electrically connects the MOSFET drain electrode with an outside connection object. The lead frame 7 is placed separately from the heat sink 4 and is extended toward outside of the resin mold portion 8. The lead frame 7 is electrically connected to the MOSFET gate electrode via a bonding wire 12 and functions as wiring that electrically connects the gate electrode with an outside connection object.

The resin mold portion 8 is made of high heat-resistance resin such as epoxy resin. The resin mold portion 8 is configured by placing the orderly connected components (such as the semiconductor chip 1, the metal block 2, the heat sinks 3 and 4, and the lead frames 5 through 7) in a molding tool and then injecting the resin into the molding tool. The resin mold portion 8 is configured to seal the components, expose one end of each of the lead frames 5 through 7, and expose one side of the heat sinks 3 and 4.

The basic structure of the semiconductor device is configured as described above. The surface of each component of the semiconductor device includes a double-layered bonding layer 13 so that the semiconductor device can improve an adhesive force and reduce a stress between the resin mold portion 8 and each component.

The bonding layer 13 includes a first layer 13a formed over the surface of each component and configures an adhesion application resin layer that improves an adhesive force applied to each component. Specifically, the first layer 13a provides a stronger adhesive force to each component than that generated when the resin mold portion 8 is formed to be in contact with the surface of each component. The first layer 13a is configured as an organic resin layer that is vitrified under a high temperature between 200° C. and 250° C. Namely, the first layer 13a is made of organic resin that satisfies 0<tan δ≤0.3 in terms of loss coefficient tan δ in the temperature range between 200° C. and 250° C. and is vitrified without a transition to glass. For example, the first layer 13a can use polyimide, polyamide-imide, or polyimide silicon. The first resin layer 13a is formed by soaking the components in organic resin solution containing a constituent material of the first resin layer 13a or spraying the organic resin solution onto the components before the molding.

A second layer 13b is formed in the vicinity of the obverse side of the first layer 13a, namely, the side of the bonding layer 13 in contact with the resin mold portion 8. The second layer 13b configures a stress reduction resin layer that reduces a stress between each component and the resin mold portion 8. The second layer 13b uses an organic resin layer capable of reducing a stress under a high temperature between 200° C. and 250° C. A high adhesive force is generated between the second layer 13b and the resin mold portion 8. The adhesive force is at least stronger than that generated when the resin mold portion 8 is formed to be in contact with the surface of each component. The second layer 13b is made of a resin material whose dispersion peak of loss coefficient tan δ (hereinafter referred to as tan δ dispersion peak) falls within the range of 1.0≤tan δ <2 in the temperature range between 200° C. and 250° C. For example, the second layer 13b can be made of polyimide or polyamide-imide. The second resin layer 13b is formed by soaking the components after molding the first resin layer 13a in organic resin solution containing a constituent material of the second resin layer 13b or spraying the organic resin solution onto the components.

The first layer 13a is configured so that loss coefficient tan δ satisfies the above-mentioned range. The second layer 13b is configured so that the tan δ dispersion peak is included in the above-mentioned range. The reason follows. The description below explains the reason with reference to FIG. 2.

Figure 2:
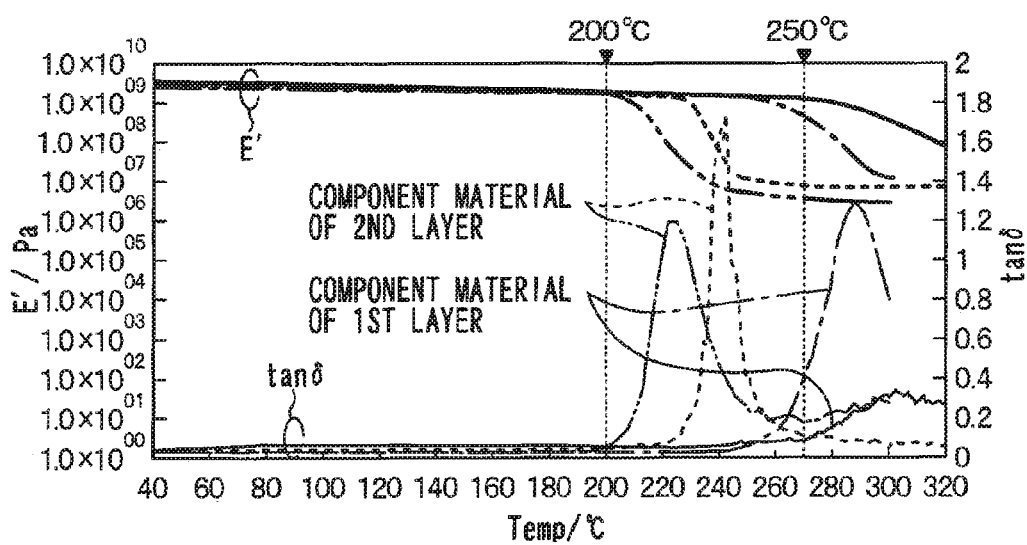
FIG. 2 is a diagram illustrating a relationship among temperature Temp (unit: ° C.), storage elastic modulus E' (unit: Pa), and loss coefficient tan δ of the semiconductor device.

FIG. 2 illustrates relationship among temperature Temp (unit: ° C.) storage elastic modulus E' (unit: Pa), and loss coefficient tan δ of the semiconductor device. Storage elastic modulus E' signifies an element of energy retained in an object when the object generates the energy due to an external force and distortion. Storage elastic modulus E denotes an element that returns the applied energy without time lag when an external force is applied to the object. Loss coefficient tan δ represents a ratio between storage elastic modulus E' and loss elastic modulus E" and is used as a parameter to indicate the stress reduction. Loss elastic modulus E" signifies an element of energy dispersed outside when the object generates the energy due to an external force and distortion. Namely, loss elastic modulus E" denotes an element that returns the applied energy with a time lag when an external force is applied to the object. This example uses loss coefficient tan δ as a parameter to indicate the stress reduction. Originally, an area corresponding to a variation in loss elastic modulus E" is used as a parameter to indicate the stress reduction. However, loss elastic modulus E" varies widely and cannot be illustrated clearly. Generally, loss coefficient tan δ is used as a parameter to indicate the stress reduction.

According to the data in FIG. 2, materials used for the first layer 13a ensure that loss coefficient tan δ is included in the range of 0<tan δ≤0.3 in the temperature range between 200° C. and 250° C. The glass state is maintained in the temperature range between 200° C. and 250° C. when the first layer 13a uses at least an organic resin whose loss coefficient tan δ is included in the range of 0<tan δ≤0.3. The adhesive force can be maintained. For this reason, the first layer 13a uses the organic resin whose loss coefficient tan δ is included in the range of 0<tan δ≤0.3.

According to the data in FIG. 2, materials used for the second layer 13b ensure that the tan δ dispersion peak (the peak of loss coefficient tan δ) is included in the range of 1.0≤tan δ<2 in the temperature range between 200° C. and 250° C. This signifies that the glass transition occurs in the temperature range between 200° C. and 250° C. and causes active molecular motion when the second layer 13b uses an organic resin whose tan δ dispersion peak is included in the range of 1.0≤tan δ<2 in the temperature range between 200° C. and 250° C. For this reason, the use of the organic resin can reduce a stress generated under high temperature due to a linear expansion coefficient difference between a component and the resin mold portion 8 as thermal energy due to molecular motion of the organic resin. For this reason, the second layer 13b uses the organic resin whose tan δ dispersion peak is included in the range of 1.0≤tan δ<2.

Polyimide and polyamide-imide are provided as examples of the organic resin used for the first layer 13a and the second layer 13b and contain different compositions. In each organic resin, tan δ just needs to satisfy the above-mentioned conditions. The first layer 13a and the second layer 13b each are configured as an organic resin layer. High adhesiveness is available between the layers and the adhesiveness can be maintained under a high temperature at least between 200° C. and 250° C.

The semiconductor device according to the above-mentioned configuration includes the bonding layer 13 disposed between the resin mold portion 8 and each component. The bonding layer 13 uses a double-layered structure including the first layer 13a and the second layer 13b instead of a single-layered structure. The first layer 13a and the second layer 13b independently function as an adhesion application resin layer and a stress reduction resin layer, respectively. The first layer 13a can ensure strong adhesive force between each component and the resin mold portion 8. In addition, the second layer 13b enables the stress reduction. This can ensure adhesive force between the constituent members and provide a stress reduction structure at the same time. This can also ensure a strong sticking force, prevent each component from peeling away from the resin mold portion 8, and reduce a stress under high temperature. Each component can be prevented from peeling away from the resin mold portion 8 under a high temperature between 200° C. and 250° C.

Specifically, the inventors conducted an experiment to confirm whether or not each component peels away from the resin mold portion 8 by configuring the first layer 13a and the second layer 13b using materials a through e and performing a hot-cold cycle test 1000 cycles in the temperature range between −40° C. and 225° C.

In the experiment, the inventors sprayed a solvent-containing organic resin over the heat sink, dried the organic resin, molded the organic resin using the same mold material A, hardened the mold material, activated an adhesive force between the mold material and the organic resin, and then conducted a hot-cold cycle test. The inventors used materials a through e illustrated in FIG. 3. Material a corresponds to polyimide that indicates glass-transition temperature Tg (unit: ° C.) set to 300 and the maximum value of tan δ set to 0.08 in the temperature range between 200° C. and 250° C. Material b corresponds to polyamide-imide that indicates glass-transition temperature Tg (unit: ° C.) set to 260 and the maximum value of tan δ set to 0.06 in the temperature range between 200° C. and 250° C. Material c corresponds to polyimide that indicates glass-transition temperature Tg (unit: ° C.) set to 210 and the maximum value of tan δ set to 1.74 (at 242° C.) in the temperature range between 200° C. and 250° C. Material d corresponds to polyimide silicon that indicates glass-transition temperature Tg (unit: ° C.) set to 250 and the maximum value of tan δ set to 0.28 in the temperature range between 200° C. and 250° C. Material e corresponds to polyamide-imide that indicates glass-transition temperature Tg (unit: ° C.) set to 220 and the maximum value of tan δ set to 1.19 (at 225° C.) in the temperature range between 200° C. and 250° C.

As illustrated in FIG. 4, the first layer 13a and the second layer 13b are provided in five combinations, namely, materials a and c, materials a and e, materials b and c, materials d and c, and materials d and e. Organic resins such as materials a, b, and d are characterized by loss coefficient tan δ that is included in the range of 0<tan δ≤0.3 in the temperature range between 200° C. and 250° C. These materials are used for the first layer 13a. Organic resins such as materials c and e are characterized by the tan δ dispersion peak that is included in the range of 1.0≤tan δ<2 in the temperature range between 200° C. and 250° C. These materials are used for the second layer 13b.

Specifically, a first example (E1) uses material a for the first layer 13a and material c for the second layer 13b. A second example (E2) uses material a for the first layer 13a and material e for the second layer 13b. A third example (E3) uses material b for the first layer 13a and material c for the second layer 13b. A fourth example (E4) uses material d for the first layer 13a and material c for the second layer 13b. A fifth example (E5) uses material d for the first layer 13a and material e for the second layer 13b.

As a result, the first through fifth examples reveal 0% peeling, namely, no peeling between each component and the resin mold portion 8 even after the hot-cold cycle test, producing a good result of reliability.

As comparison examples, the inventors conducted the same experiment using the above-mentioned materials a through e under the condition that the bonding layer 13 is configured as a single-layered structure or characteristics of the organic materials used for the layers 13a and 13b are reversed while maintaining the double-layered structure of the first layer 13a and the second layer 13b. Specifically, the first comparison example (CE1) through the fifth comparison example (CE5) configure the bonding layer 13 as a single-layered structure using materials a through e. The sixth comparison example (CE6) through the tenth comparison example (CE10) configure the bonding layer 13 as a double-layered structure including the first layer 13a and the second layer 13b. The sixth comparison example configures the first layer 13a using material c and the second layer 13b using material a. The seventh comparison example configures the first layer 13a using material c and the second layer 13b using material b. The eighth comparison example configures the first layer 13a using material c and the second layer 13b using material d. The ninth comparison example configures the first layer 13a using material e and the second layer 13b using material a. The tenth comparison example configures the first layer 13a using material e and the second layer 13b using material b.

As a result, as illustrated in FIG. 5, only the first comparison example shows the peeling area of smaller than 20% (<20%) when material a is selected for the bonding layer 13 as a single-layered structure. All the other comparison examples show the peeling area of larger than or equal to 20% (≥20%), not producing a good result of reliability.

Also from these results, the first layer 13a is preferable to use an organic resin characterized by loss coefficient tan δ that belongs to the range of 0<tan δ≤0.3 in the temperature range between 200° C. and 250° C. The second layer 13b is preferable to use an organic resin characterized by the tan δ dispersion peak that belongs to the range of 1.0≤tan δ<2 in the temperature range between 200° C. and 250° C.

(Other Embodiments)

The present disclosure is not limited to the above-mentioned embodiment but may be modified as needed.

For example, the above-mentioned embodiment includes the lead frames 5 through 7 connected to the gate, source, and drain electrodes since the MOSFET is used as an example of the semiconductor element. The required number of lead frames depends on a semiconductor element to be used. For example, only lead frames connected to the anode and cathode electrodes suffice when a Schottky barrier diode is used as a semiconductor element.

While there has been described the embodiment using an example of the structure including the metal block 2 and the heat sinks 3 and 4 in addition to the semiconductor device 1, the present disclosure is also applicable to the semiconductor device 1 sealed by the resin mold portion 8.

The above-mentioned embodiment describes the example of loss coefficient tan δ for preferred materials as organic resins used for the first layer 13*a* and the second layer 13*b*. However, the embodiment provides only an example. Namely, loss coefficient tan δ for the first layer 13*a* may be smaller than that for the second layer 13*b* at least in the temperature range between 200° C. and 250° C. The first layer 13*a* may function as an adhesion application resin layer to increase the adhesive force. The second layer 13*b* may function as a stress reduction resin layer to enable stress reduction.

The invention claimed is:

1. A semiconductor device comprising:
a semiconductor chip having an obverse side and a reverse side, the semiconductor chip including a semiconductor element;
a resin mold portion sealing a component in which the semiconductor chip is included; and
a bonding layer disposed between the resin mold portion and the component, wherein
the bonding layer is made of an organic resin that is disposed at an obverse side of the component,
the bonding layer has a double-layered structure including a first layer bonded to the component and a second layer bonded to the resin mold portion, and
a loss coefficient tan δ of the first layer is smaller than a loss coefficient tan δ of the second layer within a temperature range of 200° C. to 250° C.

2. The semiconductor device according to claim 1, wherein the first layer is made of an organic resin that has a loss coefficient δ satisfying 0<tan δ≤0.3 within a temperature range of 200° C. to 250° C.

3. The semiconductor device according to claim 2, wherein the organic resin of the first layer is provided by one of polyimide, polyamide-imide, or polyimide silicon.

4. The semiconductor device according to claim 1, wherein the second layer is made of an organic resin that has a loss coefficient δ satisfying 1.0≤tan δ<2 within a temperature range of 200° C. to 250° C.

5. The semiconductor device according to claim 4, wherein the organic resin of the second layer is provided by one of polyimide or polyamide-imide.

6. The semiconductor device according to claim 1, wherein
the component includes:
a first heat sink connected to an obverse side of the semiconductor chip; and
a second heat sink connected to a reverse side of the semiconductor chip,
the first heat sink and the second heat sink are sealed in the resin mold portion by exposing a surface of each of the first heat sink and the second heat sink,
the exposed surface of the first heat sink is opposite to the semiconductor chip and the exposed surface of the second heat sink is opposite to the semiconductor chip, and
the exposed surface of the first heat sink and the exposed surface of the second heat sink radiate heat generated by the semiconductor chip toward outside.

* * * * *